(12) United States Patent
Shinjo et al.

(10) Patent No.: US 6,873,208 B2
(45) Date of Patent: Mar. 29, 2005

(54) HIGH-FREQUENCY AMPLIFIER

(75) Inventors: Shintaro Shinjo, Tokyo (JP); Kazutomi Mori, Tokyo (JP); Hiroyuki Joba, Tokyo (JP); Hiroaki Nagano, Tokyo (JP); Mitsuru Motizuki, Tokyo (JP); Yukio Ikeda, Tokyo (JP); Noriharu Suematsu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 303 days.

(21) Appl. No.: 10/069,664

(22) PCT Filed: Jun. 29, 2001

(86) PCT No.: PCT/JP01/05667

§ 371 (c)(1),
(2), (4) Date: Jul. 2, 2002

(87) PCT Pub. No.: WO02/03546

PCT Pub. Date: Jan. 10, 2002

(65) Prior Publication Data

US 2003/0048135 A1 Mar. 13, 2003

(30) Foreign Application Priority Data

Jun. 30, 2000 (JP) ................................. PCT/JP00/04367

(51) Int. Cl.[7] ................................................ H03G 3/20
(52) U.S. Cl. ....................................... 330/129; 330/136
(58) Field of Search ................................. 330/129, 136, 330/296, 285, 124 R, 295, 310, 98

(56) References Cited

U.S. PATENT DOCUMENTS

| 5,196,807 | A | | 3/1993 | Fujisawa |
| 5,410,275 | A | | 4/1995 | Black |
| 5,757,229 | A | * | 5/1998 | Mitzlaff ................... 330/124 R |
| 5,923,215 | A | * | 7/1999 | Hans .......................... 330/149 |
| 6,445,247 | B1 | * | 9/2002 | Walker ........................ 330/10 |

FOREIGN PATENT DOCUMENTS

| JP | 56-80906 | 7/1981 |
| JP | 58-178612 | 10/1983 |
| JP | 116719/1985 | 8/1985 |
| JP | 62-274906 | 11/1987 |
| JP | 2-149108 | 6/1990 |
| JP | 5-308232 | 11/1993 |
| JP | 9-107299 | 4/1997 |
| JP | 09-270650 | 10/1997 |
| JP | 2000-59157 | 2/2000 |
| KR | 13963 | 12/1982 |
| KR | 1998-067988 | 12/1998 |

OTHER PUBLICATIONS

Tetsuo Sato et al.: "Intelligent RF power module using automatic bias control (ABC) system for PCS CDMA applications" IEEE MTT–S. Microwave Symp. Dig., pp. 201–204, 1998.

* cited by examiner

*Primary Examiner*—Henry Choe
(74) *Attorney, Agent, or Firm*—Oblon, Spivak, McClelland, Maier & Neustadt, P.C.

(57) ABSTRACT

A high-frequency amplifying unit 2 in which a steep gain variation developed according to a change in the amplitude of input high-frequency signal is suppressed is provided. It amplifies an input high-frequency signal with a plurality of transistors 12-1 to 12-N at the same time a measuring circuit 27 measures amplitude of the input high-frequency signal, and a bias control circuit 26 continuously controls a bias applied to each transistors 12-1 to 12-N according to the value of amplitude measured by the measuring circuit 27. Thus it is possible to suppress a steep gain variation produced according to a variation in the amplitude of input high-frequency signal.

15 Claims, 9 Drawing Sheets

TO CURRENT ADDING (SUBTRACTING) CIRCUIT

HIGH-FREQUENCY AMPLIFIER

BACKGROUND OF THE INVENTION

1. Field of the Invention

The present invention relates to a high-frequency amplifying device which is used in, for example, a mobile communication terminal to amplify a high-frequency signal.

2. Description of the Rior Art

FIG. 1 is a block diagram showing a configuration of conventional high-frequency amplifying device described in, for example, "Intelligent RF Power Module Using Automatic Bias Control (ABC) System for PCS CDMA Applications" (Sato et al., IEEE MTT-S Int. Microwave Symp. Dig. p.p. 201–204, 1998). In the figure, reference numeral 201 indicates an input terminal, 202-1 indicates a first-stage transistor for amplifying a high-frequency signal, and 202-2 indicates a second-stage transistor for amplifying the high-frequency signal. 203-1 indicates a bias feed circuit such as a distributed constant circuit, a resistor, an inductor, a capacitor or the like for biasing the input of transistor 202-1, and 203-2 indicates a bias feed circuit for biasing the input of transistor 202-2. 204-1 indicates a pull-up circuit provided on the output side of transistor 202-1, 204-2 indicates a pull-up circuit provided on the output side of transistor 202-2, and 205 indicates an output terminal, respectively.

In addition, reference numeral 211 indicates a transistor for detecting an input signal, 212 indicates a pull-up circuit on the output side of transistor 211, and 213 indicates a comparator for comparing a reference voltage generated by a reference voltage source 214 and a voltage of signal detected by the transistor 211. 214 indicates a reference voltage source for generating a predetermined reference voltage, and 215 indicates a variable voltage source for applying a voltage corresponding to the result of comparison by the comparator 213 to each bias feed circuits 203-1 and 203-2.

The operation will next be explained.

A-high-frequency signal supplied via the input terminal 201 is amplified by the transistors 202-1 and 202-2 and the post-amplification high-frequency signal is output through the output terminal 205.

On the other hand, the transistor 211 detects the high-frequency signal supplied via the input terminal 201 and supplies a post-detection signal to the comparator 213. The comparator 213 compares a reference voltage generated by the reference voltage source 214 and a voltage of signal detected by the transistor 211 and supplies a signal (e.g., a signal of 0 or 1) indicative of whether the voltage of post-detection signal is higher than the reference voltage, to a variable voltage source 215. The variable voltage source 215 changes the voltage to apply to each bias feed circuits 203-1 and 203-2 according to whether or not the voltage of input signal is higher than the reference voltage.

Thus the biases to be applied to the transistors 202-1 and 202-2 are changed according to the voltage (power) of input signal to reduce power consumption at low output power.

However, because the conventional high-frequency amplifying device is constructed as described above, it has been accompanied by problems that a variation in gain at their changing is large and, for example, further reduction in power consumption is difficult, since the biases to be applied to the transistors are changed discontinuously based on whether or not the voltage of input signal is higher than the reference voltage. There was a possibility that when the variation in gain at the changing was large, a shift occurred in the phase of a signal, thus causing defective conditions upon detection. When a system, such as a W-CDMA (Wideband Code Division Multiple Access) system which is placed under strict constraints on a gain fluctuation band width, is used in a communication apparatus or the like, it has been difficult to meet such constraints when the gain variation at the changing is large.

The present invention has been made to solve the foregoing problems. Therefore the present invention aims to provide a high-frequency amplifying device comprising a high-frequency amplifying unit having a plurality of the amplifying elements for amplifying the input high-frequency signal; a measuring circuit for measuring amplitude of the input high-frequency signal; and a bias control circuit for continuously controlling a bias applied to each amplifying elements according to value of the amplitude measured by the measuring circuit, whereby a steep gain variation developed according to a change in the amplitude of input high-frequency signal can be suppressed.

SUMMARY OF THE INVENTION

According to a first aspect of the present invention, a high-frequency amplifying device comprises: a high-frequency amplifying unit having a plurality of the amplifying elements for amplifying the input high-frequency signal; a measuring circuit for measuring amplitude of the input high-frequency signal; and a bias control circuit for continuously controlling a bias applied to each amplifying elements according to value of the amplitude measured by the measuring circuit. By this arrangement, an effect is obtained that a steep gain variation developed according to a change in the amplitude of input high-frequency signal can be suppressed. Further, another effect is obtained that the circuit scale can be reduced since the bias control circuit collectively controls bias applied to the plurality of amplifying elements.

According to a second aspect of the present invention, a high-frequency amplifying device in which bias control circuit has a current adding circuit for outputting a current having a value corresponding to the amplitude measured by the measuring circuit, and a bias applying circuit for applying a bias corresponding to the sum of current output from the current adding circuit and a predetermined reference current to the plurality of amplifying elements is provided. By this arrangement an effect is obtained that the bias can be reduced continuously and power consumption at low output power can be further reduced when the amplitude of input high-frequency signal becomes small.

According to a third aspect of the present invention, a high-frequency amplifying device in which bias control circuit has a detection adjusting circuit for setting value of a current conducted according to the amplitude of the high-frequency signal when the measuring circuit measures the amplitude thereof is provided. By this arrangement an effect is obtained that an operating condition for the measuring circuit can be controlled and an adjustment of the device can be carried out with ease.

According to a fourth aspect of the present invention, a high-frequency amplifying device in which current adding circuit has a current mirror circuit for allowing a current having a value corresponding to the amplitude measured by the measuring circuit to conduct into one end thereof and according to the current, outputting another current set based on a ratio between junction areas of the current mirror circuit and a source voltage from the other end thereof is provided.

By this arrangement an effect is obtained that the characteristic of current to the bias applying circuit with respect to the amplitude of input high-frequency signal can easily be adjusted by adjusting the ratio between the junction areas of current mirror circuit and the source voltage thereof, and in its turn the bias applied to each amplifying elements can be adjusted with ease.

According to a fifth aspect of the present invention, a high-frequency amplifying device in which bias applying circuit has an internal amplifying element for conducting the current output from the current adding circuit and the predetermined reference current, and the internal amplifying element and the plurality of amplifying elements of the high-frequency amplifying unit constitute a current mirror circuit is provided.

According to a sixth aspect of the present invention, a high-frequency amplifying device in which bias control circuit has a current subtracting circuit for inputting thereto a current having a value corresponding to the amplitude measured by the measuring circuit, and a bias applying circuit for supplying the current to the current subtracting circuit and applying a bias corresponding to a difference between a predetermined reference current and said current to the plurality of amplifying elements is provided. By this arrangement an effect is obtained that it is possible to continuously increase the bias when the input high-frequency signal is reduced in amplitude, and thereby compensate for a gain reduction at low output power.

According to a seventh aspect of the present invention, a high-frequency amplifying device in which bias control circuit has a detection adjusting circuit for setting a value of current conducted according to the amplitude of high-frequency signal when the measuring circuit measures the amplitude thereof is provided. By this arrangement an effect is obtained that the operating condition for measuring circuit can be controlled, and hence an adjustment of the device can easily be performed.

According to an eighth aspect of the present invention, a high-frequency amplifying device in which current subtracting circuit has a current mirror circuit for allowing a current having a value corresponding to the amplitude measured by the measuring circuit to conduct into one end thereof and according to the current, inputting another current set based on a ratio between junction areas of the current mirror circuit and a source voltage from the other end thereof is provided. By this arrangement an effect is obtained that the characteristic of current from the bias applying circuit with respect to the amplitude of input high-frequency signal can easily be adjusted by adjusting the ratio between the junction areas of current mirror circuit and the source voltage thereof, and in its turn the bias applied to each amplifying elements can be adjusted with ease.

According to a ninth aspect of the present invention, a high-frequency amplifying device in which bias applying circuit has an internal amplifying element for conducting the remaining current obtained by subtracting the current supplied to the current subtracting circuit from the predetermined reference current, and the internal amplifying element and the plurality of amplifying elements of the high-frequency amplifying unit constitute a current mirror circuit is provided.

According to a tenth aspect of the present invention, a high-frequency amplifying device in which measuring circuit is connected in parallel with the high-frequency amplifying unit is provided. By this arrangement an effect is obtained that the amplitude of high-frequency signal can be measured without degradation of the high-frequency signal supplied to the high-frequency amplifying unit.

According to an eleventh aspect of the present invention, a high-frequency amplifying device in which measuring circuit, current adding circuit and detection adjusting circuit are connected in parallel with the high-frequency amplifying unit is provided. By this arrangement an effect is obtained that the measuring circuit, the detection adjusting circuit and the current subtracting circuit can be implemented in a one-chip integrated circuit, thus it makes possible to reduce the scale and cost of the device.

According to a twelfth aspect of the present invention, a high-frequency amplifying device in which measuring circuit, current subtracting circuit and detection adjusting circuit are connected in parallel with high-frequency amplifying unit is provided. By this arrangement an effect is obtained that the measuring circuit, the detection adjusting circuit and the current subtracting circuit can be implemented in a one-chip integrated circuit, thus it makes possible to reduce the scale and cost of the device.

According to a thirteenth aspect of the present invention, a high-frequency amplifying device in which measuring circuit has a detector circuit connected in series with the high-frequency amplifying unit, for passing the high-frequency signal to the high-frequency amplifying unit and detecting the high-frequency signal is provided. By this arrangement an effect is obtained that it is not necessary to additionally provide a divider for allowing the high-frequency signal to divide into the measuring circuit and the high-frequency amplifying unit, and hence a circuit scale can be reduced.

According to a fourteenth aspect of the present invention, a high-frequency amplifying device comprises: a high-frequency amplifying unit having a plurality of the amplifying elements for amplifying the input high-frequency signal; a measuring circuit for measuring the amplitude of input high-frequency signal; and a plurality of bias control circuits for respectively independently controlling continuously biases applied to the respective amplifying elements according to the value of amplitude measured by the measuring circuit. By this arrangement an effect is obtained that the biases can independently be set according to the frequency characteristics and physical characteristics of the respective amplifying elements, for example.

According to a fifteenth aspect of the present invention, a high-frequency amplifying device in which each bias control circuits has a current adding circuit for outputting a current having a value corresponding to the amplitude measured by the measuring circuit, and a bias applying circuit for applying a bias corresponding to the sum of current output from the current adding circuit and a predetermined reference current to the each amplifying element is provided. By this arrangement an effect is obtained that the power consumption at low output power can be further reduced since the biases applied to the respective amplifying elements can be established independently.

According to a sixteenth aspect of the present invention, a high-frequency amplifying device in which each bias control circuit has a current subtracting circuit for inputting thereto a current having a value corresponding to the amplitude measured by the measuring circuit, and a bias applying circuit for supplying the current to the current subtracting circuit and applying a bias corresponding to the difference between a predetermined reference current and the current to the each amplifying element is provided. By this arrangement an effect is obtained that the compensation for a gain reduction at low output power can be carried out more suitably since the biases for the respective amplifying elements can beset independently.

According to a seventeenth aspect of the present invention, a high-frequency amplifying device in which each bias control circuit of a predetermined number of stages on the front side, of the plurality of bias control circuits has a current subtracting circuit for inputting thereto a current having a value corresponding to the amplitude measured by the measuring circuit, and a bias applying circuit for supplying the current to the current subtracting circuit and applying a bias corresponding to the difference between a predetermined reference current and the supplied current to the each amplifying element, and each remaining bias control circuits on the rear side has a current adding circuit for outputting a current having a value corresponding to the amplitude measured by the measuring circuit, and a bias applying circuit for applying a bias corresponding to the sum of current output from the current adding circuit and a predetermined reference current to the each amplifying element is provided. By this arrangement an effect is obtained that a reduction in distortion and a reduction in power consumption at low output power can be rendered compatible.

DETAILED DESCRIPTION OF THE PREFERED EMBODIMENT

In order to describe the present invention in more details, best modes for carrying out the present invention will hereinafter be described with reference to the accompanying drawings.

Embodiment 1

Figure 2:
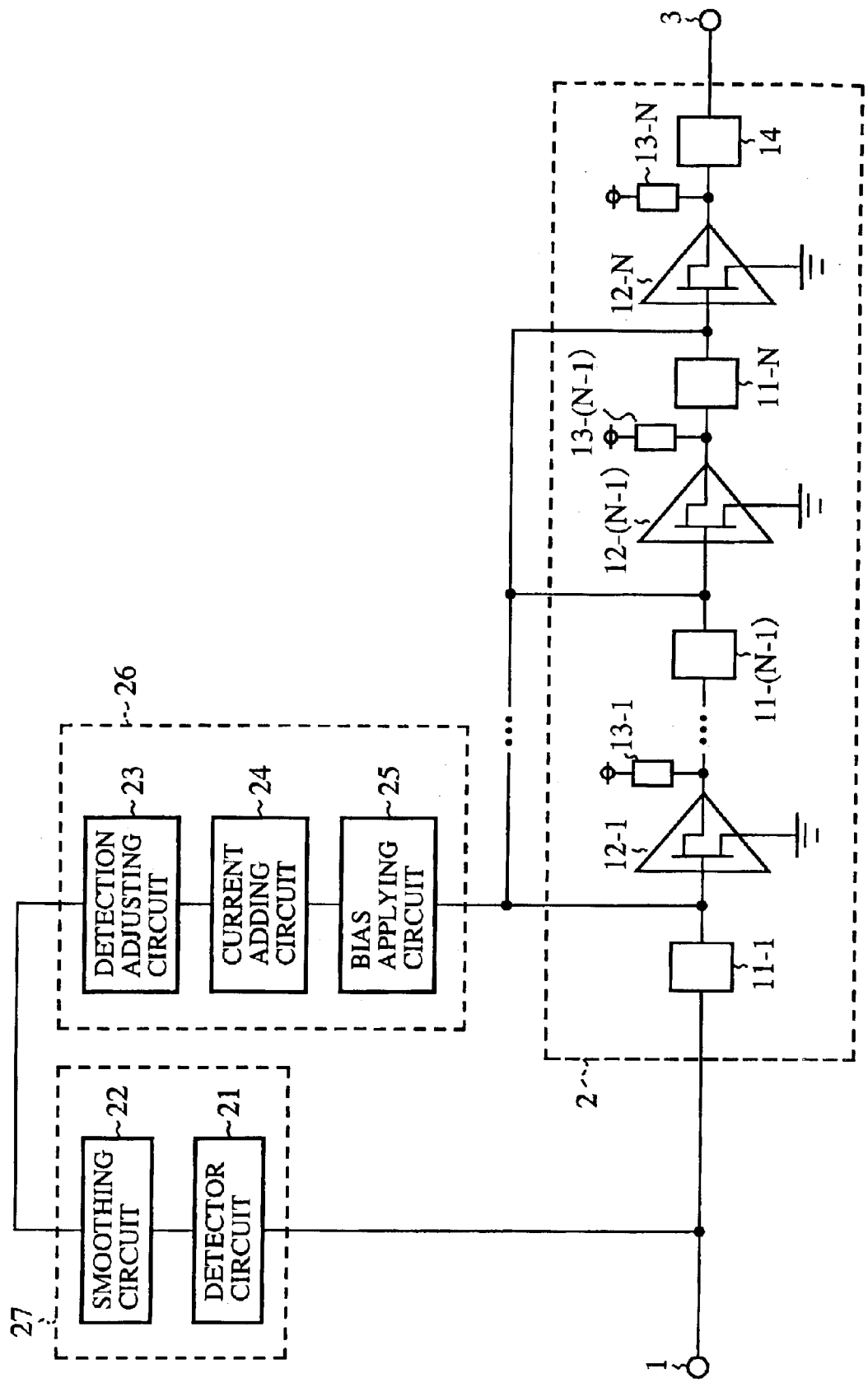
FIG. 2 is a block diagram showing a configuration of high-frequency amplifying device according to an embodiment 1 of the present invention.

FIG. 2 is a block diagram showing a configuration of high-frequency amplifying device according to an embodiment 1 of the present invention. In the figure, reference numeral 1 indicates an input terminal, 2 indicates a high-frequency amplifying unit having transistors 12-1 to 12-N of N stages (where N≧2), and 3 indicates an output terminal.

In the high-frequency amplifying unit 2, reference numerals 11-1 to 11-N respectively indicate matching circuits respectively provided at stages prior to the transistors, and 12-1 to 12-N, 12-1 to 12-N respectively indicate the transistors of N stages (amplifying elements) for amplifying a RF or high-frequency signal. 13-1 to 13-N respectively indicate pull-up circuits provided at the outputs of transistors 12-1 to 12-N, and 14 indicates a matching circuit provided at a stage prior to the output terminal 3, respectively.

Reference numeral 21 indicates a detector circuit such as a diode for detecting an input signal, and 22 indicates a smoothing circuit such as a capacitor for smoothing a post-detection signal. Incidentally, the detector circuit 21 and the smoothing circuit 22 constitute a measuring circuit 27 for measuring the amplitude of input signal.

Reference numeral 23 indicates a detection adjusting circuit for adjusting or regulating a current passing through the detector circuit 21 and the smoothing circuit 22, 24 indicates a current adding circuit for supplying a current of value corresponding to the amplitude of input signal to a bias applying circuit 25, based on the current adjusted by the detection adjusting circuit 23, and 25 indicates a bias applying circuit for adding the current supplied from the current adding circuit 24 to a reference current and applying a bias corresponding to the post-addition current to the bases of transistors 12-1 to 12-N, respectively. Incidentally, the detection adjusting circuit 23, the current adding circuit 24, and the bias applying circuit 25 constitute a bias control circuit 26.

Figure 1:
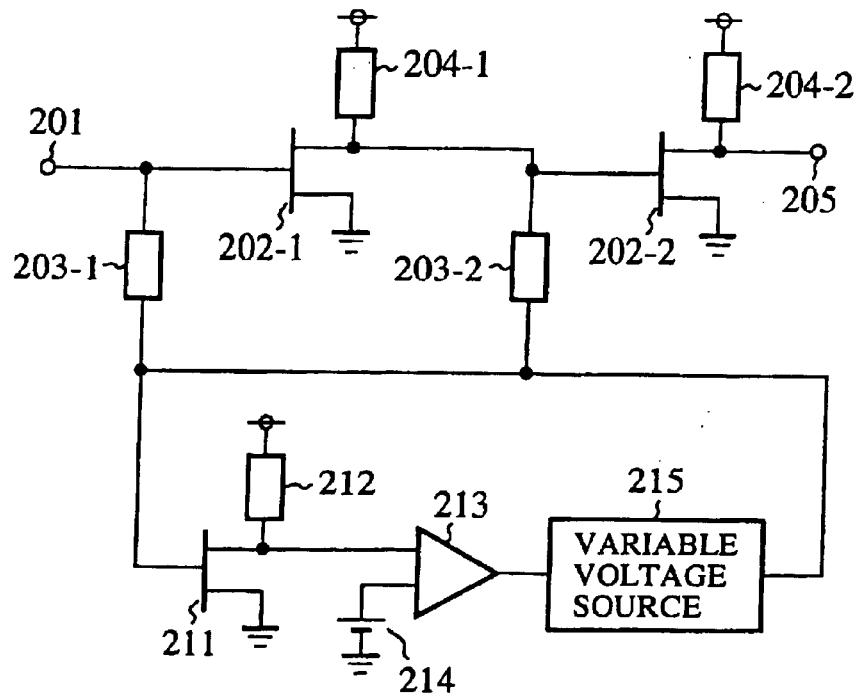
FIG. 1 is a block diagram showing a configuration of conventional high-frequency amplifying device.
Figure 3:
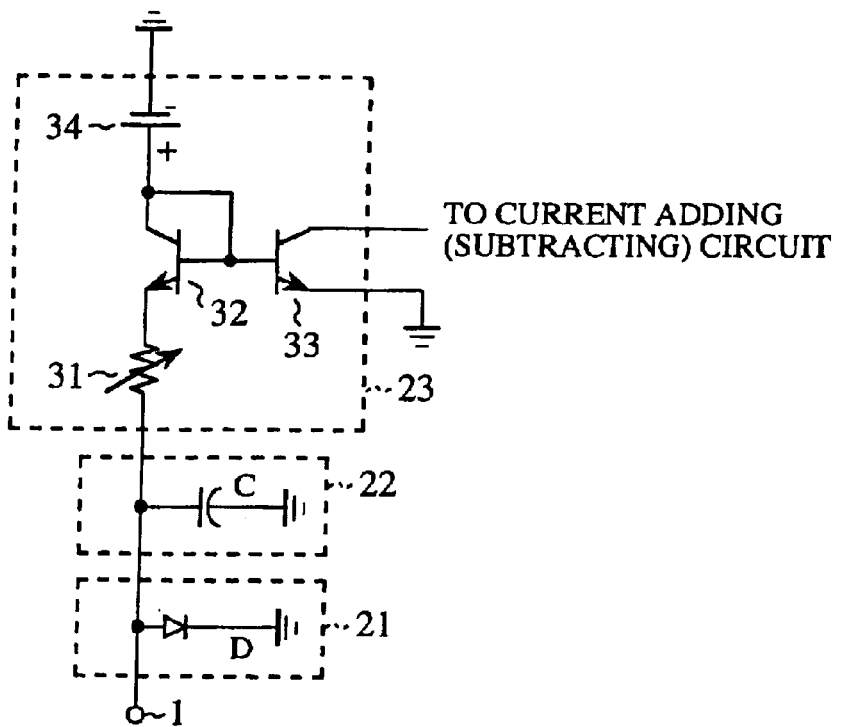
FIG. 3 is a circuit diagram showing an example of configuration of a detection adjusting circuit shown in FIG. 2.

Examples of configurations of the detection adjusting circuit 23, the current adding circuit 24 and the bias applying circuit 25 at the time that N type bipolar transistors are used as the transistors 12-1 to 12-N, will now be shown. FIG. 3 is a circuit diagram showing an example of configuration of the detection adjusting circuit 23 shown in FIG. 2, FIG. 4 is a circuit diagram showing an example of configuration of the current adding circuit 24, and FIG. 5 is a circuit diagram showing an example of configuration of the bias applying circuit 25.

In the detection adjusting circuit 23 shown in FIG. 3, reference numeral 31 indicates a variable resistor provided between an N type transistor 32 and a smoothing circuit 22, 32 and 33 respectively indicate the N type transistors constituting a current mirror circuit whose one end is connected to the variable resistor 31 and other end is connected to the current adding circuit 24, and 34 indicates a power supply connected to the collector and base of the N type transistor 32 and the base of N type transistor 33. Incidentally, a current mirror circuit conducts a current through one end thereof and the other end thereof at the same ratio as a ratio between junction areas of transistors, an N type transistor-based current mirror circuit allows currents to flow in from one end thereof and the other end thereof, and a P type transistor-based current mirror circuit allows currents to flow out from one end thereof and the other end thereof. The detector circuit 21 comprises a diode D as shown in FIG. 3 by way of example, and the smoothing circuit 22 is made up of a capacitor C as shown in FIG. 3 by way of example. Incidentally, the capacitance value of capacitor C is set according to a chip rate of the high-frequency signal, etc. The capacitor C serves so as to smooth a post-detection signal and suppresses the flowing of high-frequency signal into the bias control circuit 26.

Figure 4:
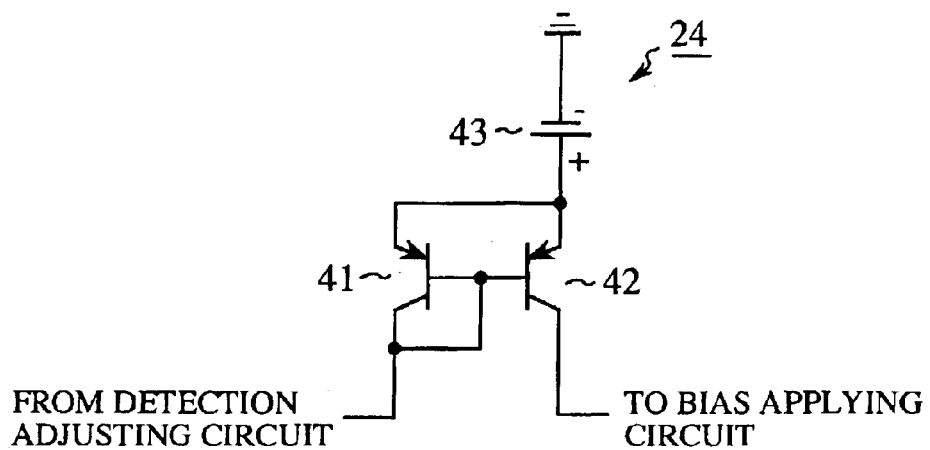
FIG. 4 is a circuit diagram showing an example of configuration of a current adding circuit shown in FIG. 2.

In the current adding circuit 24 shown in FIG. 4, reference numerals 41 and 42 respectively indicate P type transistors that constitute a current mirror circuit whose one end is connected to the detection adjusting circuit 23 and whose other end is connected to the bias applying circuit 25, and reference numeral 43 indicates a power supply connected to the emitters of P type transistors 41 and 42.

Figure 5:
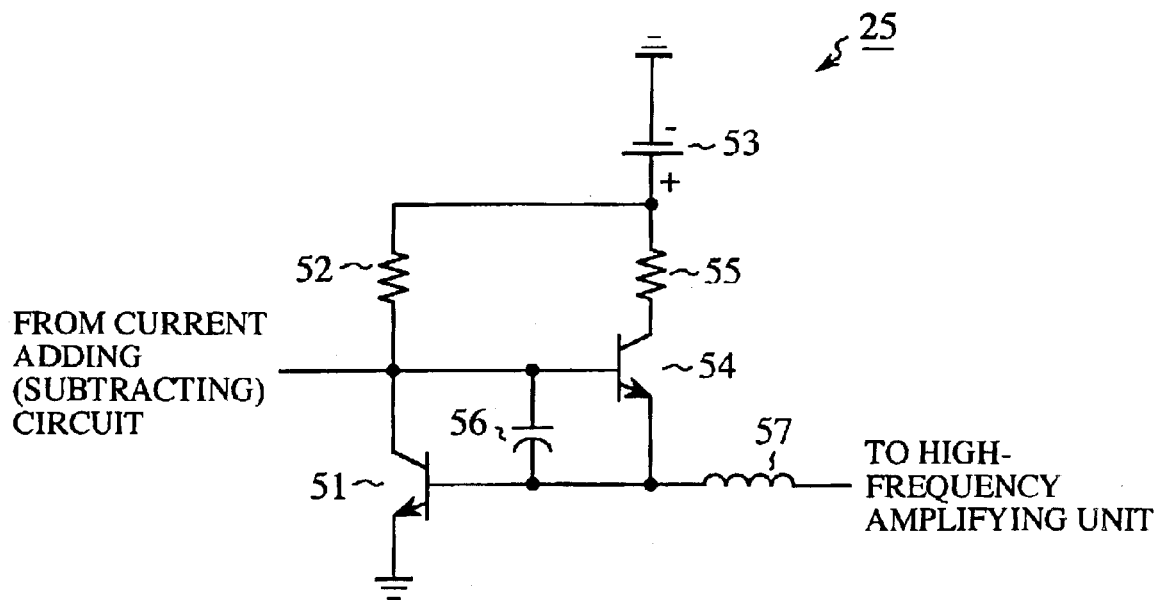
FIG. 5 is a circuit diagram showing an example of configuration of a bias applying circuit shown in FIG. 2.

In the bias applying circuit 25 shown in FIG. 5, reference numeral 51 indicates an N type transistor (internal amplifying element) whose collector is connected to the current adding circuit 24 and whose emitter is grounded, 52 indicates a resistor provided between the collector of N type transistor 51 and a power supply 53, 53 indicates the power supply, 54 indicates an N type transistor whose base is connected to the collector of N type transistor 51 and whose emitter is connected to the base of N type transistor 51, 55 indicates a resistor provided between the collector of N type transistor 54 and the power supply 53, 56 indicates a capacitor, and 57 indicates an inductor which is provided between the base of N type transistor 51 and the bases of transistors 12-1 to 12-N of the high-frequency amplifying unit 2 to suppress the flowing of a high-frequency signal from the high-frequency amplifying unit 2, respectively. Incidentally, the N type transistor 51 constitutes a current mirror circuit together with the N type transistors 12-1 to 12-N of the high-frequency amplifying unit 2.

The operation will next be explained.

The high-frequency signal supplied via the input terminal 1 is amplified by the transistors 12-1 to 12-N of the high-frequency amplifying unit 2 and the amplified high-frequency signal is output through the output terminal 3.

On the other hand, the detector circuit 21 detects the high-frequency signal supplied via the input terminal 1 and supplies the post-detection signal to the smoothing circuit 22. The smoothing circuit 22 smoothes the signal. Incidentally, the detection adjusting circuit 23 connected to the smoothing circuit 22 adjusts a current passing through the detector circuit 21 and the smoothing circuit 22. The current adding circuit 24 supplies a current of value corresponding to the amplitude of input signal to the bias applying circuit 25, based on the current adjusted by the detection adjusting circuit 23. The bias applying circuit 25 adds the current supplied from the current adding circuit 24 to a reference current and applies a bias corresponding to the so-added current to the bases of transistors 12-1 to 12-N. Thus when the amplitude of input signal increases, the post-addition current increases and the bias applied to each bases of transistors 12-1 to 12-N becomes large. On the other hand, when the amplitude of input signal decreases, the post-addition current is reduced and the bias applied to each base of transistors 12-1 to 12-N decreases.

A description will now be made of operation at the time that the respective parts are configured as shown in FIGS. 3 through 5.

First, the detector circuit 21 and the smoothing circuit 22 extract the voltage amplitude of an input signal and allow a current corresponding to the voltage amplitude of input signal to conduct into the N type transistor 32 of current mirror circuit, based on the resistance value of variable resistor 31 and the voltage of power supply 34. Thus a current obtained by multiplying the current by a ratio between junction areas of the N type transistors 32 and 33 is allowed to conduct into the N type transistor 33 of current mirror circuit (see FIG. 3).

The same current is caused to conduct even into the P type transistor 41 of current mirror circuit in the current adding circuit 24, which is connected to the N type transistor 33. Thus a current having a value obtained by multiplying the current by a ratio between junction areas of the P type transistors 41 and 42 is allowed to conduct into the P type transistor 42 of current mirror circuit (see FIG. 4).

In the bias applying circuit 25, a reference bias for the N type transistor 51 is determined according to a voltage from the power supply 53, a resistance value of the resistor 52 and an emitter-to-base voltage of the N type transistor 54 when no current is supplied from the current adding circuit 24. A reference current corresponding to the reference bias serves so as to make continuity between the collector and emitter. When the current is supplied from the current adding circuit 24, the current is added to the reference current, followed by flowing into the collector of N type transistor 51 of the bias applying circuit 25. The bias applied to the base of N type transistor 51 also varies according to the change in the emitter-to-collector current. Since the N type transistor 51 constitutes the current mirror circuit together with the transistors 12-1 to 12-N of high-frequency amplifying unit 2, the bias applied to each bases of transistors 12-1 to 12-N of the high-frequency amplifying unit 2 also changes in the same manner as described above (see FIG. 5).

Thus the detector circuit 21, the smoothing circuit 22, the detection adjusting circuit 23, the current adding circuit 24 and the bias applying circuit 25 continuously adjust the bias for each transistors 12-1 to 12-N of high-frequency amplifying unit 2 according to the amplitude of input signal.

Thus according to the embodiment 1, an effect is obtained that a steep gain variation produced according to a change in the amplitude of input high-frequency signal can be suppressed, since the high-frequency amplifying unit 2 having the plurality of transistors 12-1 to 12-N for amplifying the input high-frequency signal, the measuring circuit 27 for measuring the amplitude of input high-frequency signal, and the bias control circuit 26 for continuously controlling the bias applied to each transistors 12-1 to 12-N according to the value of amplitude measured by the measuring circuit 27 are provided.

According to the embodiment 1 as well, an effect is obtained that the circuit scale can be reduced since the bias control circuit 26 collectively controls the bias applied to each plurality of transistors 12-1 to 12-N.

Further according to the embodiment 1, an effect is obtained that the bias can be lowered continuously when the amplitude of input high-frequency signal is reduced, thus it makes possible to further reduce power consumption at low output power since the bias control circuit 26 has the current adding circuit 24 for outputting the current having a value corresponding to the amplitude measured by the measuring circuit 27, and the bias applying circuit 25 for applying the bias corresponding to the sum of current from the current adding circuit 24 and the predetermined reference current to each transistors 12-1 to 12-N.

Furthermore according to the embodiment 1, an effect is obtained that an operating condition (operating point of the diode constituting the detector circuit 21) for the measuring circuit 27 can be controlled and hence an adjustment of the device can be easily performed since the bias control circuit 26 has the detection adjusting circuit 23 for setting a value of current conducted or carried according to the amplitude of high-frequency signal when the measuring circuit 27 measures the amplitude.

Still further according to the embodiment 1, an effect is obtained that the characteristic of current to the bias applying circuit 25 with respect to the amplitude of input high-frequency signal can easily be adjusted by adjusting the ratio between the junction areas of current mirror circuit and the source voltage thereof, and in its turn the bias applied to each transistors 12-1 to 12-N can be adjusted with ease since the current adding circuit 24 has the current mirror circuit for allowing the current of value corresponding to the amplitude measured by the measuring circuit to conduct into one end thereof and outputting the current set based on the ratio between the junction areas of current mirror circuit and the source voltage thereof from the other end thereof according to the above current.

Still further according to the embodiment 1, an effect is obtained that the measuring circuit 27 is capable of measuring the amplitude of high-frequency signal without degradation of the high-frequency signal supplied to the high-frequency amplifying unit 2 since the measuring circuit 27 is connected in parallel with the high-frequency amplifying unit 2.

Still further according to the embodiment 1, an effect is obtained that the measuring circuit 27, the detection adjusting circuit 23 and the current adding circuit 24 can be implemented in a one-chip integrated circuit, thus it makes possible to reduce the scale and cost of the device since the measuring circuit 27, the detection adjusting circuit 23 and the current adding circuit 24 are connected in parallel with the high-frequency amplifying unit.

Embodiment 2

Figure 6:
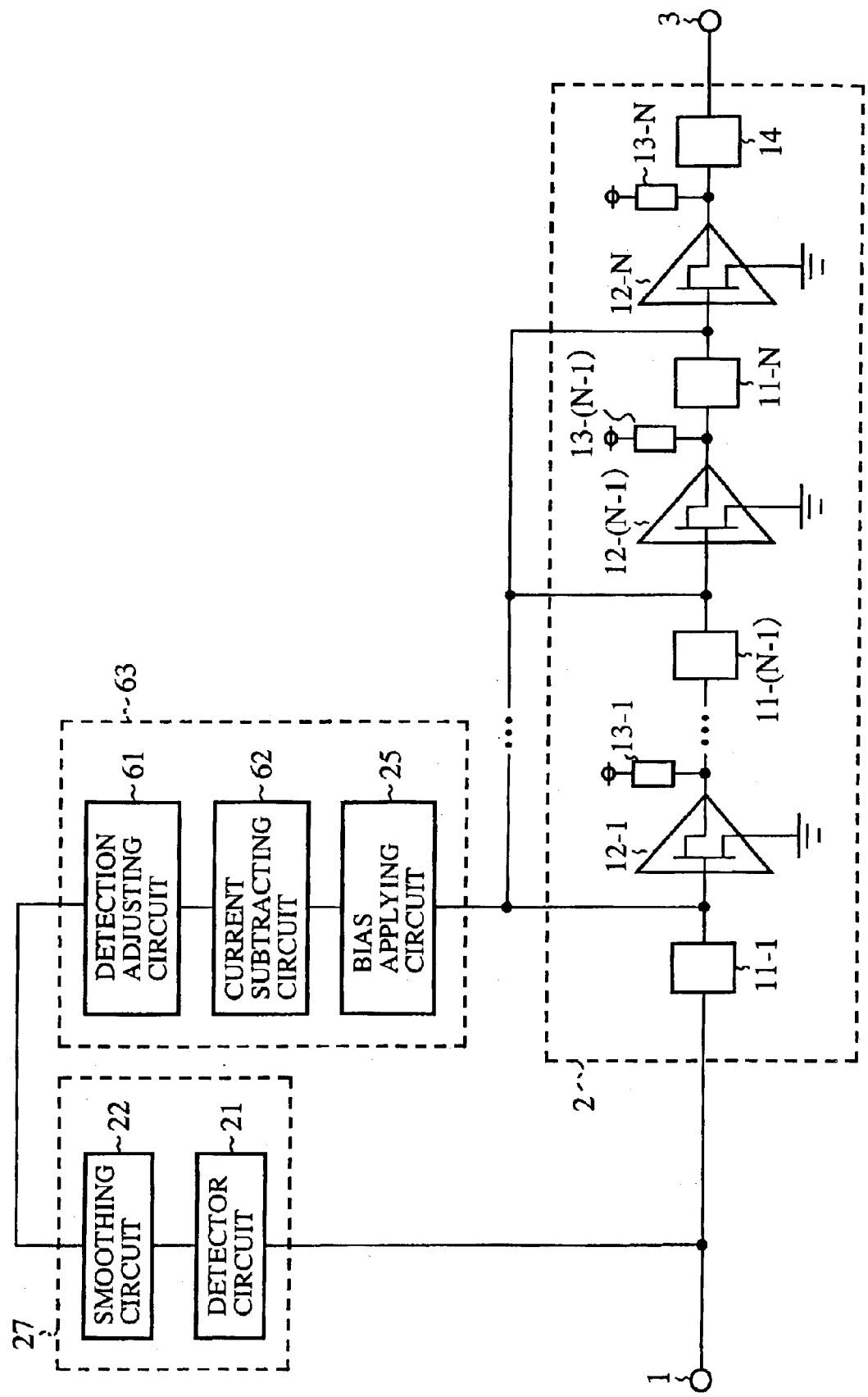
FIG. 6 is a block diagram showing a configuration of high-frequency amplifying device according to an embodiment 2 of the present invention.

FIG. 6 is a block diagram showing a configuration of high-frequency amplifying device according to an embodiment 2 of the present invention. In the figure, reference numeral 61 indicates a detection adjusting circuit for adjusting a current passing through a detector circuit 21 and a smoothing circuit 22, and 62 indicates a current subtracting circuit for causing a current having a value corresponding to the amplitude of an input signal to be supplied from a bias applying circuit 25 based on the current adjusted by the detection adjusting circuit 23. Incidentally, the detection adjusting circuit 61, the current subtracting circuit 62 and the bias applying circuit 25 constitute a bias control circuit 63.

Incidentally, since other elements of structure in FIG. 6 are similar to those employed in the embodiment 1, description on them will be omitted. However, the bias applying circuit 25 subtracts the current supplied to the current subtracting circuit 62 from a reference current and applies a bias corresponding to the post-subtraction remaining current to each bases of transistors 12-1 to 12-N.

Figure 7:
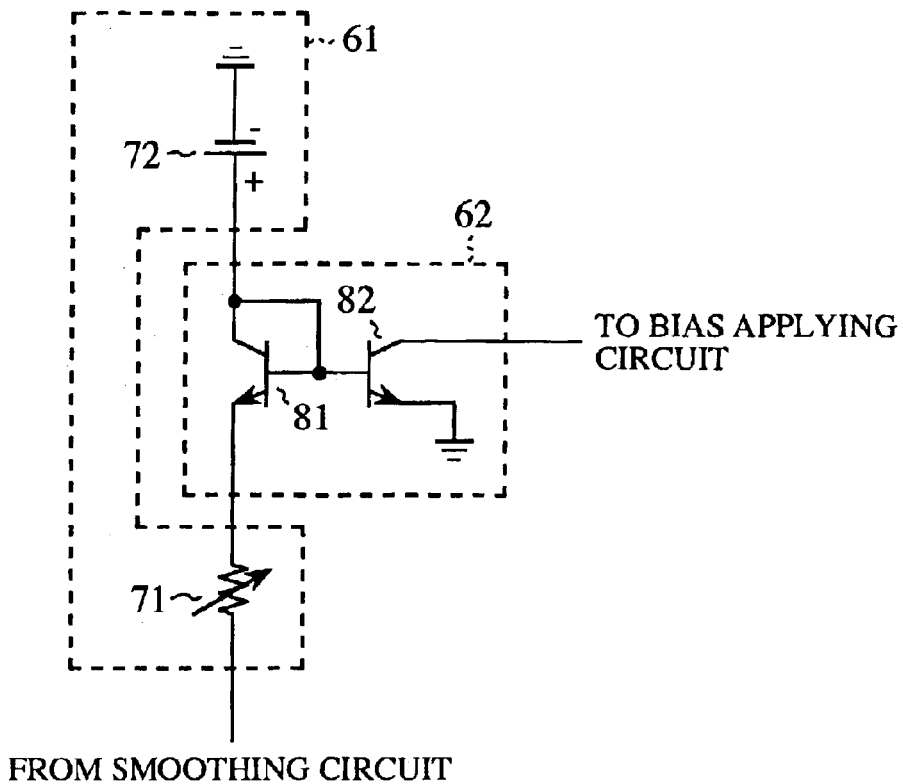
FIG. 7 is a circuit diagram showing configurations of a detection adjusting circuit and a current subtracting circuit shown in FIG. 6.

An example illustrative of configurations of the detection adjusting circuit 61 and the current subtracting circuit 62 where N type bipolar transistors are used as the transistors 12-1 to 12-N, are shown hereinafter. FIG. 7 is a circuit diagram showing the configurations of detection adjusting circuit 61 and the current subtracting circuit 62 shown in FIG. 6. In the figure, reference numeral 71 indicates a variable resistor, and 72 indicates a power supply, respectively. Designated at numerals 81 and 82 are respectively N type transistors which constitute a current mirror circuit whose one end is connected to the detection adjusting circuit 61 and whose other end is connected to the bias applying circuit 25. Incidentally, the bias applying circuit 25 in this case may make use of one shown in FIG. 5.

The operation will next be explained.

Since the high-frequency amplifying unit 2 is operated in a manner similar to the embodiment 1, the description thereof will be omitted.

The detection circuit 21 detects a high-frequency signal supplied via an input terminal 1 and supplies the post-detection signal to the smoothing circuit 22. The smoothing circuit 22 smoothes the signal. Incidentally, the detection adjusting circuit 61 connected to the smoothing circuit 22 adjusts a current passing through the detector circuit 21 and the smoothing circuit 22. The current subtracting circuit 62 causes the bias applying circuit 25 to supply a current of value corresponding to the amplitude of input signal through based on the current adjusted by the detection adjusting circuit 61. The bias applying circuit 25 subtracts the current supplied to the current subtracting circuit 62 from a reference current and applies a bias corresponding to the so-subtracted remaining current to each bases of transistors 12-1 to 12-N. Thus when the amplitude of input signal increases, the post-subtraction remaining current decreases and the bias applied to each bases of transistors 12-1 to 12-N is reduced. On the other hand, when the amplitude of input signal decreases, the post-subtraction remaining current increases and the bias applied to each bases of transistors 12-1 to 12-N becomes large.

A description will now be made for operation when the respective parts are configured as shown in FIGS. 5 and 7.

First, the detector circuit 21 and the smoothing circuit 22 extract the voltage amplitude of an input signal and allow a current corresponding to the voltage amplitude of input signal to conduct into the N type transistor 81 of current mirror circuit, based on the resistance value of variable resistor 71 and the voltage of power supply 72. Thus a current obtained by multiplying the current by a ratio between junction areas of the N type transistors 81 and 82 is allowed to conduct into the N type transistor 82 of current mirror circuit (see FIG. 7). At this time, the current which passes through the N type transistor 82, is conducted from the bias applying circuit 25 to the current subtracting circuit 62.

In the bias applying circuit 25, a reference bias for the N type transistor 51 is determined according to a voltage from the power supply 53, a resistance value of the resistor 52 and an emitter-to-base voltage of the N type transistor 54 when no current is supplied to the current subtracting circuit 62. A reference current corresponding to the reference bias serves so as to make continuity between the collector and emitter. When the current is supplied to the current subtracting circuit 62, the current is subtracted from the reference current, and thereafter the post-subtraction remaining current flows into the collector of N type transistor 51 of the bias applying circuit 25. The bias applied to the base of N type transistor 51 also varies according to a change in the emitter-to-collector current. Since the N type transistor 51 constitutes the current mirror circuit together with the transistors 12-1 to 12-N of high-frequency amplifying unit 2, the bias applied to each bases of transistors 12-1 to 12-N of the high-frequency amplifying unit 2 also changes in the same manner as described above (see FIG. 5).

Thus the detector circuit 21, the smoothing circuit 22, the detection adjusting circuit 61, the current subtracting circuit 62 and the bias applying circuit 25 continuously adjust the bias for each transistors 12-1 to 12-N of high-frequency amplifying unit 2 according to the amplitude of input signal.

Thus according to the embodiment 2, an effect is obtained that a steep gain variation produced according to a change in the amplitude of input high-frequency signal can be suppressed since the high-frequency amplifying unit 2 having the plurality of transistors 12-1 to 12-N for amplifying the input high-frequency signal, the measuring circuit 27 for measuring the amplitude of input high-frequency signal, and the bias control circuit 63 for continuously controlling the bias applied to each transistors 12-1 to 12-N according to the value of amplitude measured by the measuring circuit 27 are provided.

According to the embodiment 2 as well, an effect is obtained that the circuit scale can be reduced since the bias control circuit 63 collectively controls the bias applied to each plurality of transistors 12-1 to 12-N.

Further according to the embodiment 2, an effect is obtained that the bias can be increased continuously when the amplitude of input high-frequency signal is reduced, thus it makes possible to compensate for a gain reduction at low output power since the bias control circuit 63 has the current subtracting circuit 62 for inputting the current having a value corresponding to the amplitude measured by the measuring circuit 27, and the bias applying circuit 25 for supplying the current to the current subtracting circuit and applying the bias corresponding to the difference between a predetermined reference current and the current to a plurality of amplifying elements. That is to say, when it is necessary to compensate for a gain reduction at low output power according to the type of device used in each transistors 12-1 to 12-N, the bias control circuit 63 is used, whereas when it is necessary to reduce power consumption at low output power, the bias control circuit 26 is used.

Furthermore according to the embodiment 2, an effect is obtained that the operating condition (operating point of the diode constituting the detector circuit 21) for the measuring circuit 27 can be controlled and hence an adjustment of the device can be easily performed since the bias control circuit 63 has the detection adjusting circuit 61 for setting a value of current conducted according to the amplitude of high-frequency signal when the measuring circuit 27 measures the amplitude thereof.

Still further according to the embodiment 2, an effect is obtained that the characteristic of current from the bias applying circuit 25 with respect to the amplitude of input high-frequency signal can easily be adjusted by setting the ratio between the junction areas of current mirror circuit and the source voltage thereof, and in its turn the bias applied to each transistors 12-1 to 12-N can be adjusted with ease since the current subtracting circuit 62 has the current mirror circuit for allowing the current of value corresponding to the amplitude measured by the measuring circuit 27 to conduct into one end thereof and according to the current, causing another current set based on the ratio between the junction areas of the current mirror circuit and the source voltage thereof to be inputted from the other end thereof.

Still further according to the embodiment 2, an effect is obtained that the measuring circuit 27 is capable of measuring the amplitude of high-frequency signal without degradation of the high-frequency signal supplied to the high-frequency amplifying unit 2 since the measuring circuit 27 is connected in parallel with the high-frequency amplifying unit 2.

Still further according to the embodiment 2, an effect is obtained that the measuring circuit 27, the detection adjusting circuit 61 and the current subtracting circuit 62 can be implemented in a one-chip integrated circuit, thus it makes possible to reduce the scale and cost of the device since the measuring circuit 27, the detection adjusting circuit 61 and the current subtracting circuit 62 are connected in parallel with the high-frequency amplifying unit 2.

Embodiment 3

Figure 8:
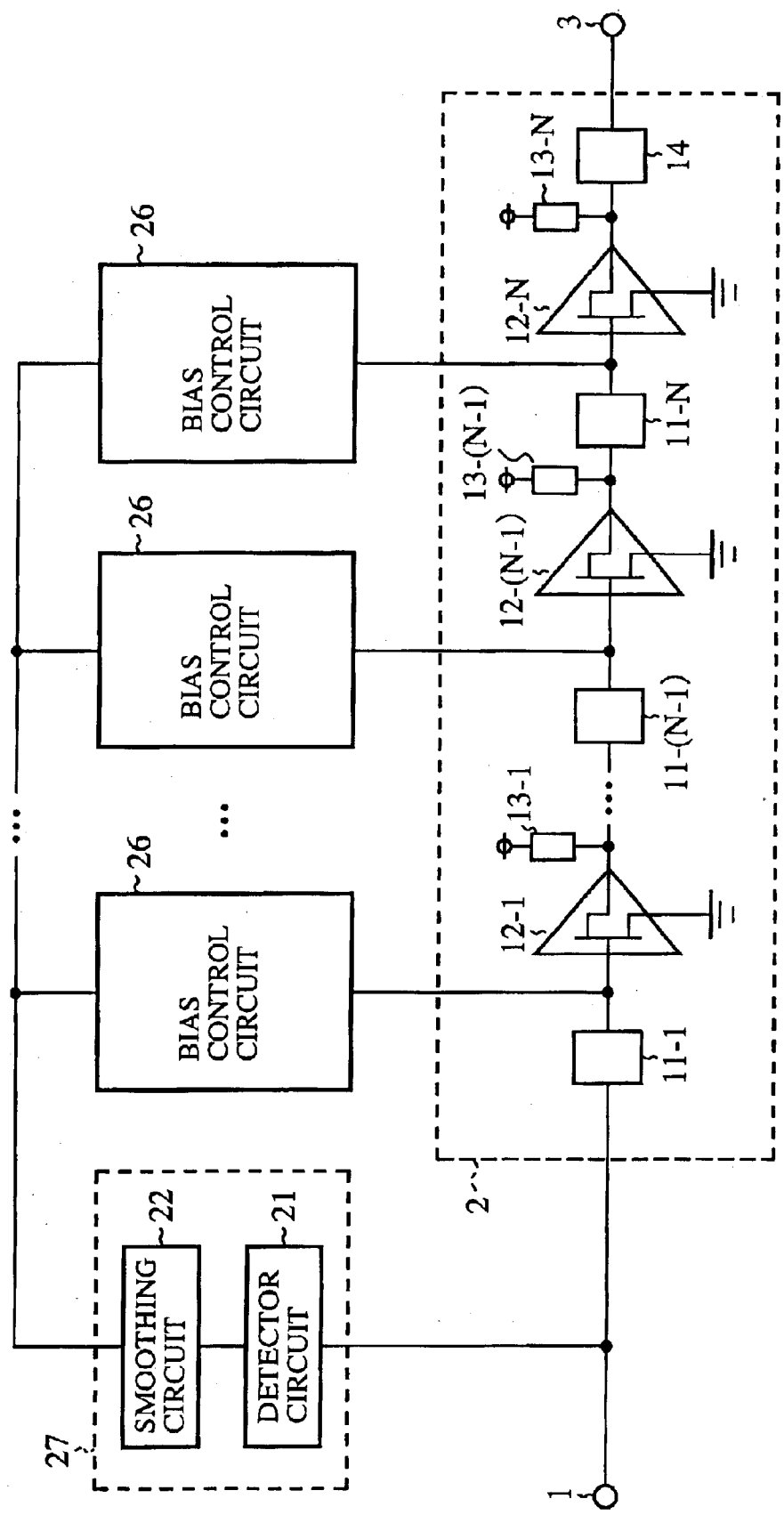
FIG. 8 is a block diagram showing a configuration of high-frequency amplifying device according to an embodiment 3 of the present invention.

FIG. 8 is a block diagram showing a configuration of high-frequency amplifying device according to an embodiment 3 of the present invention. In the high-frequency amplifying device according to the embodiment 3, N pieces of bias control circuits 26 are respectively connected to N pieces of transistors 12-1 to 12-N. Incidentally, since other configurations and configurations of the respective bias control circuits 63 in FIG. 8 are similar to those employed in the embodiment 1, description on them will be omitted.

The operation will next be explained.

In the high-frequency amplifying device according to the embodiment 3, the bias control circuits 26 provided at respective stages independently apply biases to respective transistors 12-i (where i=1, . . . , N) respectively. At this time, the respective biases are set in consideration of, for example, the frequency characteristics and physical characteristics of the respective transistors 12-i, etc. Incidentally, since the respective parts are similar in operation to those employed in the embodiment 1, the description thereof will be omitted.

Thus according to the embodiment 3, an effect is obtained that the biases can be set independently according to the frequency characteristics and physical characteristics of the respective transistors 12-i since there are provided a high-frequency amplifying unit 2 having the plurality of transistors 12-1 to 12-N for amplifying an input high-frequency signal, a measuring circuit 27 for measuring the amplitude of input high-frequency signal, and a plurality of the bias control circuits 26 for respectively independently controlling the biases applied to the respective transistors 12-i continuously according to the value of amplitude measured by the measuring circuit 27.

According to the embodiment 3 as well, since each bias control circuits 26 has a current adding circuit 24 for outputting a current corresponding to the amplitude measured by the measuring circuit 27, and a bias applying circuit 25 for applying a bias corresponding to the sum of current supplied from the current adding circuit 24 and a predetermined reference current to any of the transistors 12-1 to 12-N, an effect similar to the effect obtained in the embodiment 1 is obtained. Further, an effect is obtained that the biases applied to the respective transistors 12-i can be set independently and power consumption at low output power can be further reduced.

Embodiment 4

Figure 9:
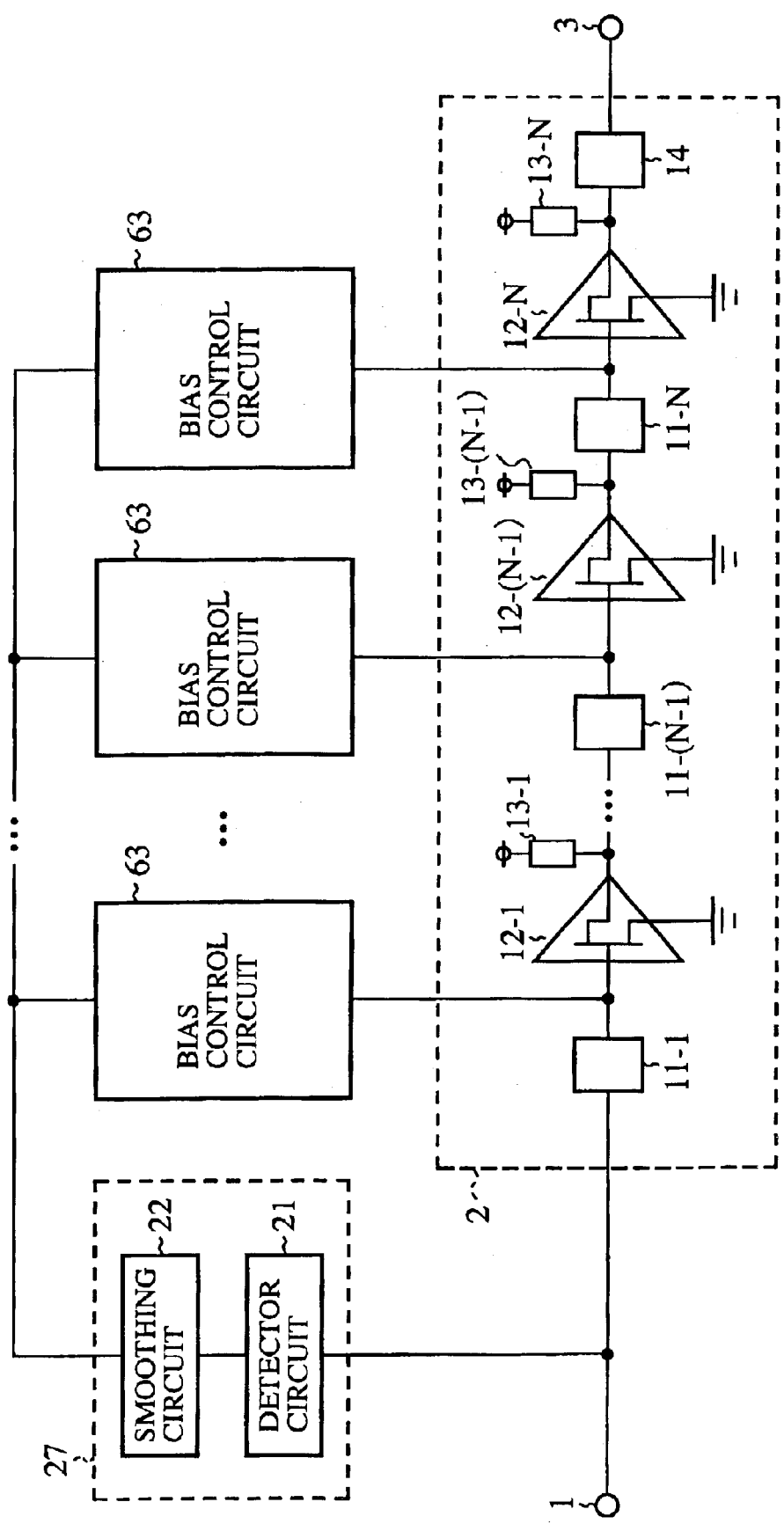
FIG. 9 is a block diagram showing a configuration of high-frequency amplifying device according to an embodiment 4 of the present invention.

FIG. 9 is a block diagram showing a configuration of high-frequency amplifying device according to an embodiment 4 of the present invention. In the high-frequency amplifying device according to the embodiment 4, N bias control circuits 63 are respectively connected to N transistors 12-1 to 12-N. Incidentally, since other configurations and configurations of the respective bias control circuits 63 in FIG. 9 are similar to those employed in the embodiment 2, description on them will be omitted.

The operation will next be explained.

In the high-frequency amplifying device according to the embodiment 4, the bias control circuits 63 provided at respective stages independently apply biases to respective transistors 12-i (where i=1, . . . , N) respectively. At this time, the respective biases are set in consideration of, for example, the frequency characteristics and physical characteristics of the respective transistors 12-i, etc. Incidentally, since the respective parts are similar in operation to those employed in the embodiment 2, the description thereof will be omitted.

Thus according to the embodiment 4, an effect is obtained that the biases can be set independently according to the frequency characteristics and physical characteristics of the respective transistors 12-i since there are provided a high-frequency amplifying unit 2 having the plurality of transistors 12-1 to 12-N for amplifying an input high-frequency signal, a measuring circuit 27 for measuring the amplitude of input high-frequency signal, and a plurality of the bias control circuits 63 for respectively independently controlling the biases applied to the respective transistors 12-i continuously according to the value of amplitude measured by the measuring circuit 27.

According to the embodiment 4 as well, since each bias control circuits 63 has a current subtracting circuit 62 for inputting a current corresponding to the amplitude measured by the measuring circuit 27, and a bias applying circuit 25 for supplying the current to the current subtracting circuit 62 and applying a bias corresponding to the difference between a predetermined reference current and the current to each amplifying element, an effect similar to the effect obtained in the embodiment 2 is obtained. Further, an effect is obtained that the biases applied to the respective transistors 12-i can be set independently and the compensation for a gain reduction at low output power can be carried out more suitably.

Embodiment 5

Figure 10:
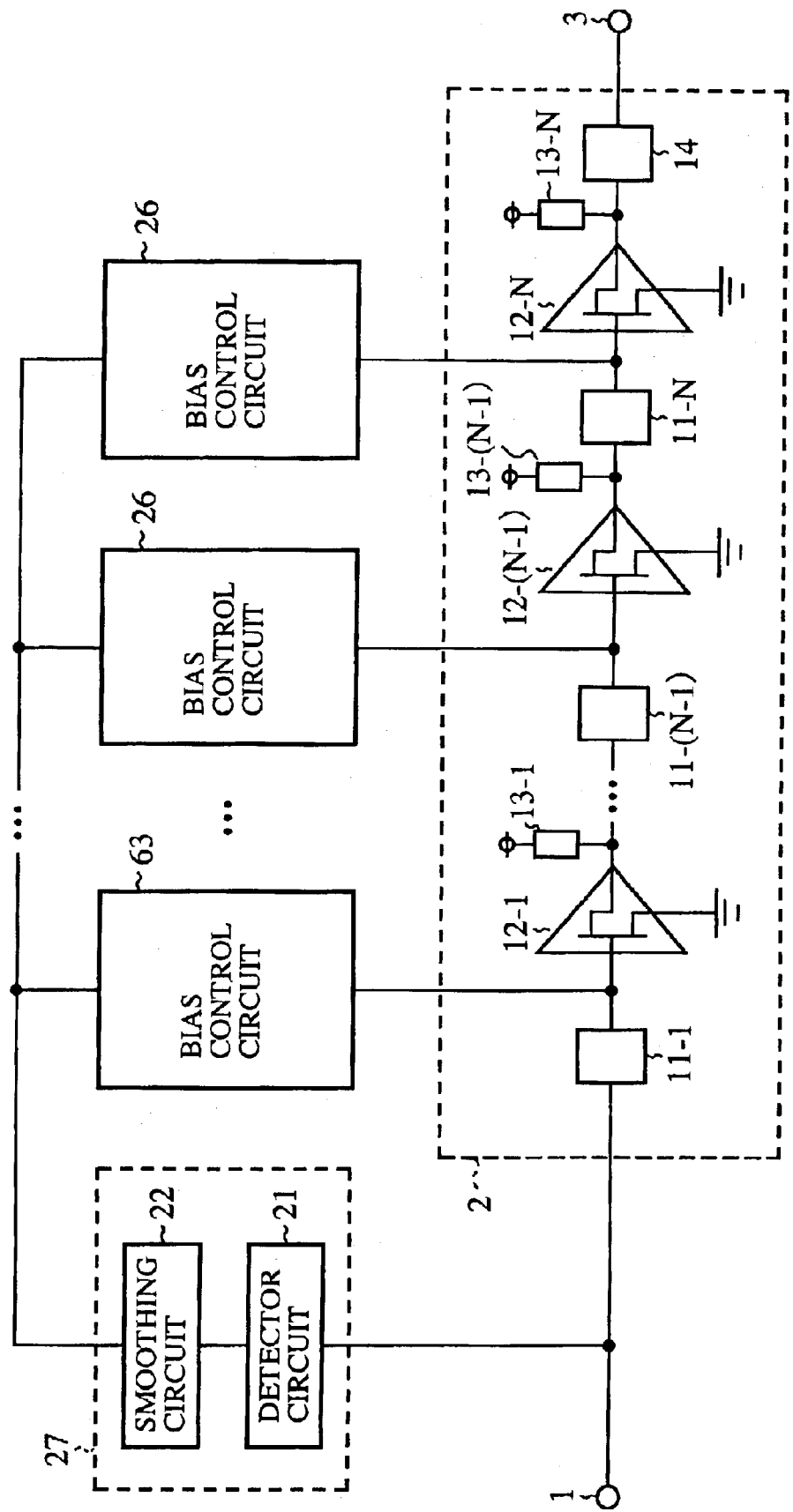
FIG. 10 is a block diagram showing a configuration of high-frequency amplifying device according to an embodiment 5 of the present invention.

FIG. 10 is a block diagram showing a configuration of high-frequency amplifying device according to an embodiment 5 of the present invention. In the high-frequency amplifying device according to the embodiment 5, bias control circuits 26 and bias control circuits 63 equal to N in total are respectively connected to N transistors 12-1 to 12-N. Incidentally, since other configurations and configurations of the respective bias control circuits 26 and 63 in FIG. 10 are similar to those employed in the embodiment 1 or embodiment 2, description on them will be omitted.

Incidentally, while the bias control circuit 63 is used in a first stage and the bias control circuits 26 are used in an (N−1)th stage and an Nth stage in FIG. 10, the combination of these is not limited to the above in particular. The bias control circuits 26 and the bias control circuits 63 may be used even by any number.

The operation will next be explained.

In the high-frequency amplifying device according to the embodiment 5, the bias control circuits 63 are provided for transistors 12-1 to 12-M of predetermined M stages on the front side, and the bias control circuits 26 are provided for transistors 12-(M−1) to 12-N of the remaining (N-M) stages. Thus biases are independently applied to their corresponding transistors 12-i (where i=1, . . . , N). At this time, the respective biases are set in consideration of, for example, the frequency characteristics and physical characteristics of the transistors 12-i, etc. Incidentally, since the respective parts are similar in operation to those employed in the embodiment 1 or embodiment 2, the description thereof will be omitted Thus according to the embodiment 5, an effect is obtained that the transistors 12-1 to 12-M used as drivers, for example, compensate for a gain reduction, and the transistors 12-(M+1) to 12-N used as power amplifiers, for example, reduce power consumption, whereby a reduction in distortion and a reduction in power consumption can be rendered compatible since the predetermined number of stages of bias control circuits 63 on the front side, of the plurality of bias control circuits 26 and 63 respectively have current subtracting circuits 62 for respectively inputting thereto a current of value corresponding to amplitude measured by a measuring circuit 27, and bias applying circuits 25 for respectively supplying the current to the current subtracting circuits 62 and applying biases each corresponding to the difference between a predetermined reference current and the current to their corresponding transistors 12-i (where i=1, . . . , M), and the remaining bias control circuits 26 on the rear side respectively have current adding circuits 24 for respectively outputting the current of value corresponding to the amplitude measured by the measuring circuit 27, and bias applying circuits 25 for respectively applying biases each corresponding to the sum of the current supplied from each current adding circuit 24 and the predetermined reference current to their corresponding transistors 12-i (where i=M+1, . . . , N)

Embodiment 6

Figure 12:
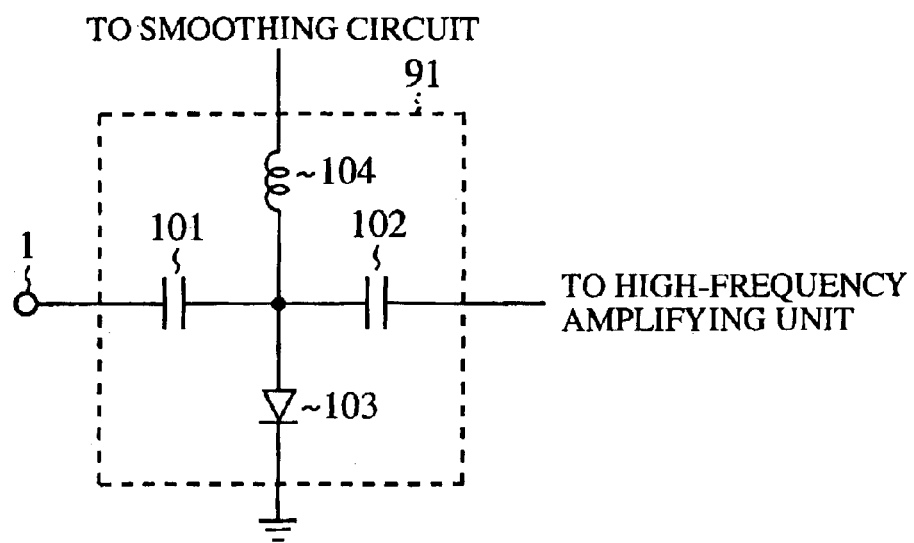
FIG. 12 is a circuit diagram showing an example of configuration of a detector circuit shown in FIG. 11.
Figure 11:
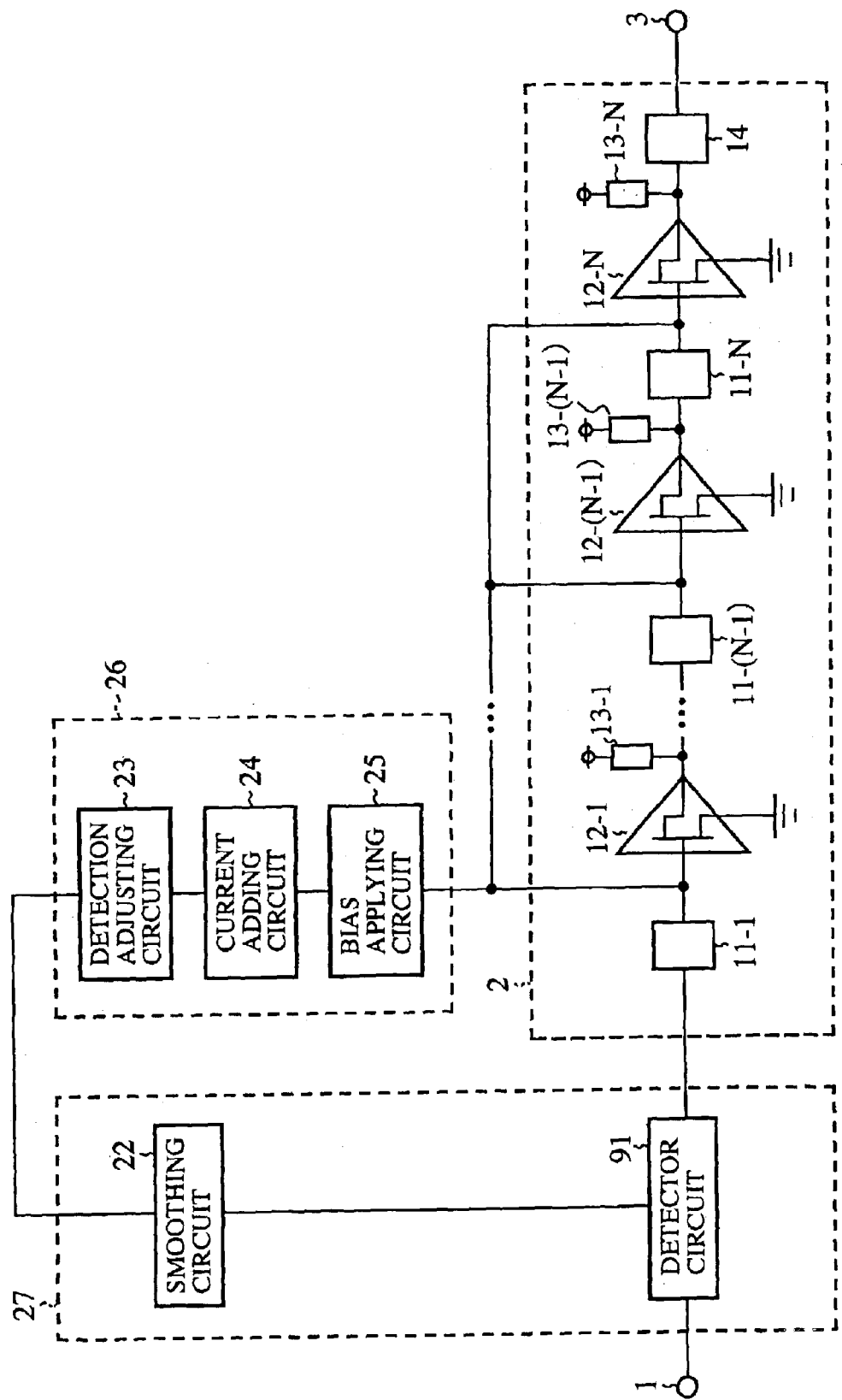
FIG. 11 is a block diagram showing a configuration of high-frequency amplifying device according to an embodiment 6 of the present invention.

FIG. 11 is a block diagram showing a configuration of high-frequency amplifying device according to an embodiment 6 of the present invention. FIG. 12 is a circuit diagram showing an example of configuration of a detector circuit 91 shown in FIG. 11. In the figure, reference numeral 91 indicates a detector circuit for passing a high-frequency signal to a high-frequency amplifying unit 2 and detecting the high-frequency signal. In the detector circuit 91, reference numeral 101 indicates a capacitor connected to an input terminal 1, for allowing the high-frequency signal to pass through and suppressing a dc component or the like, 102 indicates a capacitor connected to the high-frequency amplifying unit 2, for allowing the high-frequency signal to pass through and suppressing a dc component or the like, 103 indicates a detecting diode, and 104 indicates an inductor for suppressing a high-frequency component to the smoothing circuit 22. Incidentally, since other elements of structure shown in FIG. 11 are respectively similar to those employed in the embodiment 1, the description thereof will be omitted.

The operation will next be explained.

The detector circuit 91 supplies the input high-frequency signal to the high-frequency amplifying unit 2 through the capacitors 101 and 102. Incidentally, the high-frequency signal inputted thereto at this time is cut or blocked off by the inductor 104 and is hence not supplied to the smoothing circuit 22. On the other hand, since a component of the input high-frequency signal, which is detected by the diode 103, is of a low frequency, it is supplied to the smoothing circuit 22 through the inductor 104. Incidentally, since other operations are similar to those in the embodiment 1, the description thereof will be omitted.

Thus according to the embodiment 6, an effect is obtained that it is unnecessary to additionally provide a divider for allowing the high-frequency signal to divide into the measuring circuit 27 and high-frequency amplifying unit 2, thus it makes possible to reduce a circuit scale since the detector circuit 91 is connected in series with the high-frequency amplifying unit 2 and passes the high-frequency signal to the high-frequency amplifying unit 2, and detects the high-frequency signal.

Incidentally, while the embodiment 6 is one wherein the detector circuit 21 employed in the embodiment 1 is changed to the detector circuit 91, each detector circuits 21 employed in the embodiments 2 through 5 may be changed to the detector circuit 91. Even in this case, an effect similar to the above is obtained.

Incidentally, while the above-described embodiment has explained the case in which N type bipolar transistors are used as amplifying elements for the high-frequency amplifying unit 2 by way of example, other types of transistor or the like such as field effect transistor may be used as the amplifying elements for the high-frequency amplifying unit 2. In such a case, however, internal circuit configurations of bias control circuits 26 and 63 must be modified correspondingly.

INDUSTRIAL APPLICABILITY

As described above, the present invention is suitable to use in amplification of the high-frequency signal in, for example, a communication apparatus for transmitting and receiving a high-frequency signal

What is claimed is:

1. A high-frequency amplifying device for amplifying a high-frequency signal with a plurality of stages of amplifying elements, comprising:
   a high-frequency amplifying unit including a plurality of amplifying elements configured to amplify an input high-frequency signal;

a measuring circuit configured to measure an amplitude of the input high-frequency signal; and a plurality of bias control circuits configured to respectively independently and continuously control biases applied to respective amplifying elements according to a value of amplitude measured by said measuring circuit, wherein the plurality of bias control circuits includes at least a first bias control unit and a second bias control unit, the first bias control unit including a current subtracting unit configured to output a difference current corresponding to a difference between a first input current and a first predetermined current, and the second bias control unit including a current adding unit configured to output a sum current corresponding to a sum of a second input current and a second predetermined current.

2. The high-frequency amplifying device according to claim 1, wherein each of said plurality of bias control circuits of a predetermined number of first stages on a front side includes a current subtracting circuit configured to input thereto a supplied current having a first value corresponding to the amplitude, and a first bias applying circuit configured to apply the supplied current to the current subtracting circuit and applying a bias corresponding to a difference between a predetermined reference current and the supplied current to each of said amplifying elements, and each of said remaining bias control circuits on a rear side includes a current adding circuit configured to output an output current having a second value corresponding to the amplitude and the bias applying circuit configured to apply a second bias corresponding to a sum of the output current from the current adding circuit and the predetermined reference current to each of said amplifying elements.

3. A high-frequency amplifying device configured to amplify a high-frequency signal with a plurality of stages of amplifying elements, comprising:

a high-frequency amplifying unit including a plurality of amplifying elements configured to amplify an input high-frequency signal;

a measuring circuit configured to measure an amplitude of the input high-frequency signal; and a plurality of bias control circuits configured to respectively independently and continuously control biases applied to respective amplifying elements according to a value of amplitude measured by said measuring circuit, wherein each of the plurality of bias control circuits of a first predetermined number of front stages on a front side and a second predetermined number of back stages on a back side inludes a current subtracting circuit configured to input thereto a supplied current having a first value corresponding to the amplitude and a first bias applying circuit configured to apply the supplied current to the current subtracting circuit and a first bias corresponding to a difference between a predetermined reference current and the supplied current to each of said plurality of amplifying elements, and each of the back stages including a current adding circuit configured to output an output current having a second value corresponding to the amplitude and a second bias applying circuit configured to apply a second bias corresponding to a sum of the output current and the predetermined reference current to each of said plurality of amplifying elements.

4. The high-frequency amplifying device of claim 1, wherein the first bias control unit corresponds to a first amplifying element and the second bias control unit corresponds to a second amplifying element, and an output of the first amplifying element is in electrical communication with an input of the second amplifying element.

5. The high-frequency amplifying device of claim 1, wherein the plurality of amplifying elements are arranged in series.

6. The high-frequency amplifying device of claim 3, wherein an output of one of the first predetermined number of front stages is in electrical communication with an input of one of the second predetermined number of back stages.

7. The high-frequency amplifying device of claim 3, wherein the plurality of amplifying elements are arranged in series.

8. A high-frequency amplifying device for amplifying a high-frequency signal with a plurality of stages of amplifying elements, comprising:

a high-frequency amplifying unit having a plurality of the amplifying elements for amplifying the input high-frequency signal;

a measuring circuit for measuring an amplitude of said input high-frequency signal; and a bias control circuit for continuously controlling a bias applied to each of said amplifying elements according to a value of said amplitude measured by said measuring circuit, wherein said bias control circuit includes a current calculating circuit which is at least any one of a current adding circuit and a current subtracting circuit for outputting a current having a value corresponding to the amplitude measured by said measuring circuit, a bias applying circuit for applying a bias corresponding to the sum of current output from the current adding circuit and a predetermined reference current to the plurality of amplifying elements, and a detection adjusting circuit for setting a value of a current conducted according to said amplitude of the high-frequency signal when said measuring circuit measures the amplitude thereof.

9. The high frequency amplifying device according to claim 8, wherein said current calculating circuit has a current mirror circuit for allowing a current having a value corresponding to the measured amplitude to conduct into one end thereof, and outputting another current from the other end thereof.

10. The high-frequency amplifying device according to claim 8, wherein said bias applying circuit has an internal amplifying element for conducting the current output from the current calculating circuit and the predetermined reference current, and said internal amplifying element and the plurality of amplifying elements of said high-frequency amplifying unit constitute a current mirror circuit.

11. The high-frequency amplifying device according to claim 8, wherein said measuring circuit is connected in parallel with said high-frequency amplifying unit.

12. The high-frequency amplifying device according to claim 8, wherein said measuring circuit, said current adding circuit and said detection adjusting circuit are connected in parallel with said high-frequency amplifying unit.

13. The high-frequency amplifying device according to claim 8, wherein said measuring circuit has a detector circuit connected in series with said high-frequency amplifying unit, for passing the high-frequency signal to said high-frequency amplifying unit and detecting the high-frequency signal.

14. The high-frequency amplifying device according to claim 8, wherein said bias control circuit is pluralized.

15. The high-frequency amplifying device according to claim 14, wherein each of said bias control circuit has the bias applying circuit, and a predetermined number of stages on the front side of said plurality of bias control circuits has a current subtracting circuit as the current calculating circuit and each of said remaining bias control circuits on the rear side has a current adding circuit as the current calculating circuit.

* * * * *